United States Patent [19]

Liaw

[11] Patent Number: 5,807,779
[45] Date of Patent: Sep. 15, 1998

[54] METHOD OF MAKING TUNGSTEN LOCAL INTERCONNECT USING A SILICON NITRIDE CAPPED SELF-ALIGNED CONTACT PROCESS

[75] Inventor: Jhon-Jhy Liaw, Taipei, Taiwan

[73] Assignee: Taiwan Semiconductor Manufacturing Company Ltd., Hsin-Chu, Taiwan

[21] Appl. No.: 902,848

[22] Filed: Jul. 30, 1997

[51] Int. Cl.⁶ .................................................. H01L 21/336
[52] U.S. Cl. .................. 438/279; 438/303; 438/618; 438/637; 438/653
[58] Field of Search ..................... 438/618, 621, 438/627, 636, 637, 638, 653, 687, 688, 233, 279, 197, 303, 586, 656; 257/750, 758

[56] References Cited

U.S. PATENT DOCUMENTS

| | | | |
|---|---|---|---|
| 5,075,762 | 12/1991 | Kondo et al. ........................... | 257/288 |
| 5,223,456 | 6/1993 | Malwah .................................. | 438/586 |
| 5,391,520 | 2/1995 | Chen et al. ............................. | 438/621 |
| 5,451,543 | 9/1995 | Woo et al. .............................. | 437/195 |
| 5,451,545 | 9/1995 | Ramaswami et al. .................. | 437/200 |
| 5,480,837 | 1/1996 | Liaw et al. .............................. | 438/649 |
| 5,483,104 | 1/1996 | Godnho et al. ......................... | 257/758 |

*Primary Examiner*—T. N. Quach
*Attorney, Agent, or Firm*—George O. Saile; Stephen B. Ackerman

[57] ABSTRACT

A process for fabricating MOSFET devices, using a local interconnect structure, and silicon nitride capped, self-aligned contact openings, has been developed. The process features the creation of self-aligned contact openings, exposing specific source and drain regions. After deposition of a composite insulator layer, a second opening is formed in the composite insulator layer, again exposing various elements including the previously opened, specific source and drain regions. The formation of a local interconnect structure, filling the second opening, contacts, as well as interconnects, the specific source and drain regions.

23 Claims, 7 Drawing Sheets

5,807,779

METHOD OF MAKING TUNGSTEN LOCAL INTERCONNECT USING A SILICON NITRIDE CAPPED SELF-ALIGNED CONTACT PROCESS

BACKGROUND OF THE INVENTION (1) Field of the Invention

The present invention relates to the fabrication of semiconductor devices, and more specifically to a fabrication sequence used create metal oxide semiconductor field effect transistor, (MOSFET), devices, featuring local interconnects, and self-aligned contact, (SAC), structures.

(2) Description of Prior Art

The semiconductor industry is continually striving to improve the performance of semiconductor devices, while still attempting to reduce the cost of these same devices. These objectives have been successfully addressed by the ability of the semiconductor industry to practice micro-miniaturization, or to fabricate semiconductor devices with sub-micron features. Several fabrication disciplines, such as photolithography, as well as dry etching, have allowed micro-miniaturization to be realized. The use of more sophisticated exposure cameras, as well as the use of more sensitive photoresist films, have allowed the attainment of sub-micron images in photoresist films, to be routine achieved. In addition, the development of more advanced dry etching tools and processes, have allowed the sub-micron images, in masking photoresist films, to be successfully transferred to underlying materials used for the fabrication of semiconductor devices.

In addition to advances in semiconductor fabrication disciplines, several device structural innovations have also contributed to the quest for higher performing, lower cost, semiconductor devices. For example the use of a self-aligned contact, (SAC), procedure, allows the amount of source and drain contact area to be reduced, thus allowing smaller devices to be constructed, resulting in faster, as well as lower cost devices, to be realized. The SAC procedure, using a sub-micron ground rule, opens a sub-micron region in an insulator layer, exposing an underlying source and drain region. However only a portion of the sub-micron SAC opening is used to expose the underlying source and drain region, with the remainder of the sub-micron SAC opening overlapping an adjacent polysilicon gate structure. Therefore the source and drain contact region is smaller then the SAC opening. If the contact opening to the source and drain was to made entirely overlaying the source and drain region, the source and drain region would have to be designed larger, to accommodate the fully landed contact hole opening, thus resulting in a undesirable, larger semiconductor device.

Local interconnect structures, used as a partial, or an $M_o$ wiring level, can also be used to reduce cost, while improving the density, of advanced MOSFET devices. The use of a metal, or of a metal silicide structure, contacting, and connecting, underlying active regions of several MOSFET devices, can result in the desired cell wiring, accomplished using a short, and therefore low resistance, interconnection. This invention will describe a novel process, using silicon nitride capped, SAC processes, in conjunction with a local interconnect process, used to obtain the desired integration of MOSFET devices. Prior art such as Ramaswami, et al, in U.S. Pat. No. 5,451,545, describe a local interconnect process, but this art does not use the SAC process needed for micro-miniaturization. In addition Ramaswami, et al, describe a process for interconnecting a gate structure to a source and drain region, of a specific MOSFET device, while the present invention will describe a process for connecting elements of various MOSFET devices.

SUMMARY OF THE INVENTION

It is an object of this invention to use a novel process to fabricate a local interconnect structure, for MOSFET devices.

It is another object of this invention to use a self-aligned contact, (SAC), process, to create openings to source and drain regions, of the MOSFET devices.

It is still another object of this invention to use a double, silicon nitride capping procedure, to allow a local interconnect structure to interface, and to interconnect, specific source and drain regions, in one area of a MOSFET cell, to other source and drain regions, located in another area of the MOSFET cell, with the source and drain regions exposed in SAC openings.

In accordance with the present invention a process for integrating MOSFET device structures, using a new local interconnect, and double silicon nitride capped, SAC opening, is described. A field oxide region is created in a semiconductor substrate, followed by the creation of four polysilicon gate structures, with a first polysilicon gate structure, and a second polysilicon gate structure, located in a first region of the semiconductor substrate, and with a third polysilicon gate structure, and a fourth polysilicon gate structure, located in a second region of the semiconductor substrate, with the field oxide region separating the regions. The polysilicon gate structures are comprised of a metal silicide—polysilicon layer, underlying a capping insulator layer, and overlying a thin gate insulator layer. Lightly doped source and drain regions are formed, followed by the creation of an insulator spacer, on the sides of all polysilicon gate structures. Heavily doped source and drain regions are next formed between the first and second polysilicon gate structures, between the third and fourth polysilicon gate structures, between the second polysilicon gate structure and field oxide region, and between the third polysilicon gate structure and the field oxide region. A first silicon nitride layer is deposited and patterned to create SAC openings, with one SAC opening exposing the source and drain region between the first and second polysilicon gate structures, while a second SAC opening exposes the source and drain region between the third and the fourth polysilicon gate structures. The SAC openings are larger in width than the space between polysilicon gate structures, therefore the SAC openings also expose a portion of the top surface of the capping insulator layer, on the polysilicon gate structures. A second silicon nitride layer, as well as a interlevel dielectric layer, are next deposited. Patterning to create the opening for the local interconnect structure is next performed, first by removal of the interlevel dielectric layer, with the etching procedure terminating on the second silicon nitride layer, and followed by removal of the second silicon nitride layer, again exposing the source and drain regions between the first and the second polysilicon gate structures, as well as exposing the source and drain region between the third and fourth polysilicon gate structures. Deposition of an adhesive layer, a barrier layer, and a thick metal layer, are performed, followed by removal of unwanted metal, barrier and adhesive layers, resulting in the local interconnect structure, in the local interconnect opening, and providing the connection of the source and drain region, between the first and second polysilicon gate structures, to the source and drain region, between the third and fourth polysilicon gate structures.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The method of fabricating MOSFET devices, featuring SAC openings and a local interconnect structure, and used to interconnect various regions of a MOSFET cell, will now be covered in detail. In this description the MOSFET device described will be a N channel, (NFET), device. However this invention can also be used with P channel, (PFET), devices, or complimentary, (CMOS), devices, comprised of both PFET and NFET devices.

Figure 1:
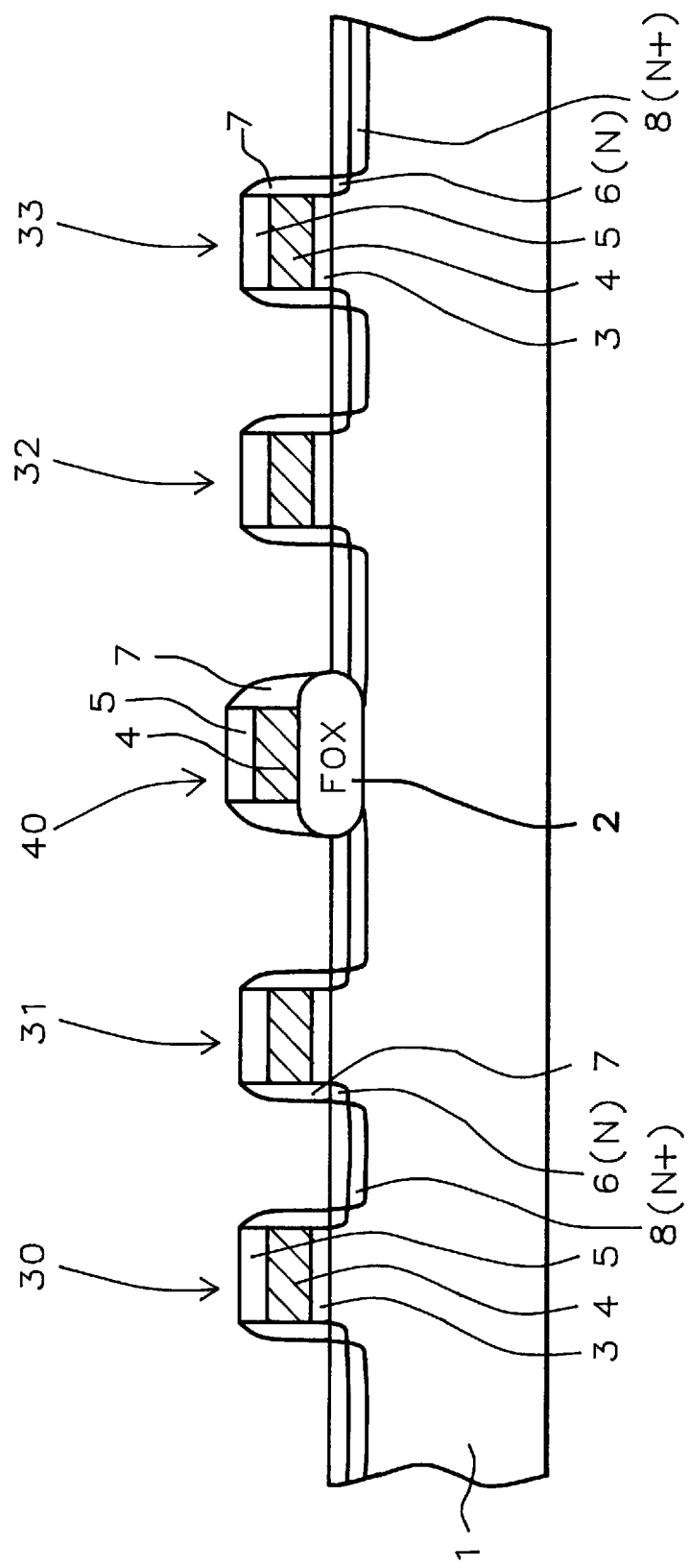
FIGS. 1–7, which schematically, in cross-sectional style, describe the Process used to fabricate MOSFET devices, using a SAC opening, and a local interconnect process, to connect source and drain regions from one area of a MOSFET cell, to source and drain regions located in another region of the MOSFET cell.

FIG. 1, schematically shows the early stages of fabrication of this invention. A P type semiconductor substrate 1, with a <100> crystallographic orientation, is used. Field oxide, (FOX), region 2, is formed for isolation purposes, as well as to provide a base for a subsequent capacitor structure to be fabricated on. FOX region 2, is formed via thermal oxidation, of exposed semiconductor substrate 1, in an oxygen—steam ambient, at a temperature between about 850° to 1050° C., to a thickness between about 3000 to 5000 Angstroms. Subsequent device regions, or regions not converted to FOX region 2, are protected by a masking pattern of an oxidation resistant composite layer, comprised of an overlying silicon nitride layer, on an underlying pad silicon oxide layer. The desired masking pattern, of the oxidation resistant composite layer, is obtained via conventional photolithographic and dry etching procedures. After formation of the FOX region 2, the masking pattern is removed, using hot phosphoric acid for silicon nitride, and a buffered hydrofluoric acid solution for the pad oxide. A gate insulator layer 3, comprised of silicon dioxide, is next formed via thermal oxidation, in an oxygen—steam ambient, at a temperature between about 850° to 1000° C., to a thickness between about 50 to 200 Angstroms. A polycide layer 4, is next deposited, comprised of an underlying, N type, in situ doped polysilicon layer, deposited to a thickness between about 1000 to 2000 Angstroms, and followed by the deposition of tungsten silicide layer, at a thickness between about 500 to 1500 Angstroms. A capping insulator layer 5, of silicon oxide is next deposited using either LPCVD or plasma enhanced chemical vapor deposition, (PECVD), to a thickness between about 1000 to 3000 Angstroms. Capping insulator layer 5, can also be a silicon nitride layer.

The capping insulator layer—polycide composite is next patterned to form polysilicon gate structures, shown schematically in FIG. 1. The patterning is accomplished using conventional photolithographic procedures, and using anisotropic reactive ion etching, (RIE), where $CHF_3$ is used as an etchant for capping insulator layer 5, while $Cl_2$ is used as an etchant for the polycide layer 4. Polysilicon gate structure 30, and polysilicon gate structure 31, are formed to the left of FOX region 2, while polysilicon gate structure 32, and polysilicon gate structure 33, are formed to the right of FOX region 2. Polysilicon gate structure 40, is formed on FOX region 2. Lightly doped source and drain regions 6, are next formed in regions not covered by polysilicon gate structures, or FOX region 2, via ion implantation of either arsenic or phosphorous, at an energy between about 20 to 80 KeV, at a dose between about $7\times10^{13}$ to $3\times10^{74}$ atoms/cm$^2$. An insulator layer of silicon oxide is next deposited, using either LPCVD or PECVD procedures, to a thickness between about 1000 to 2000 Angstroms, and subjected to an anisotropic RIE procedure, using $CHF_3$ as an etchant, creating insulator spacers 7, schematically shown in FIG. 1. Insulator spacers 7, can also be formed from a silicon nitride layer. Heavily doped source and drain regions 8, are than formed, in regions of semiconductor substrate 1, not covered by either polysilicon gate structures, or by insulator spacers 7, via ion implantation of either arsenic or phosphorous at an energy between about 25 to 80 KeV, at a dose between about $1\times10^{15}$ to $6\times10^{15}$ atoms/cm$^2$.

Figure 2:
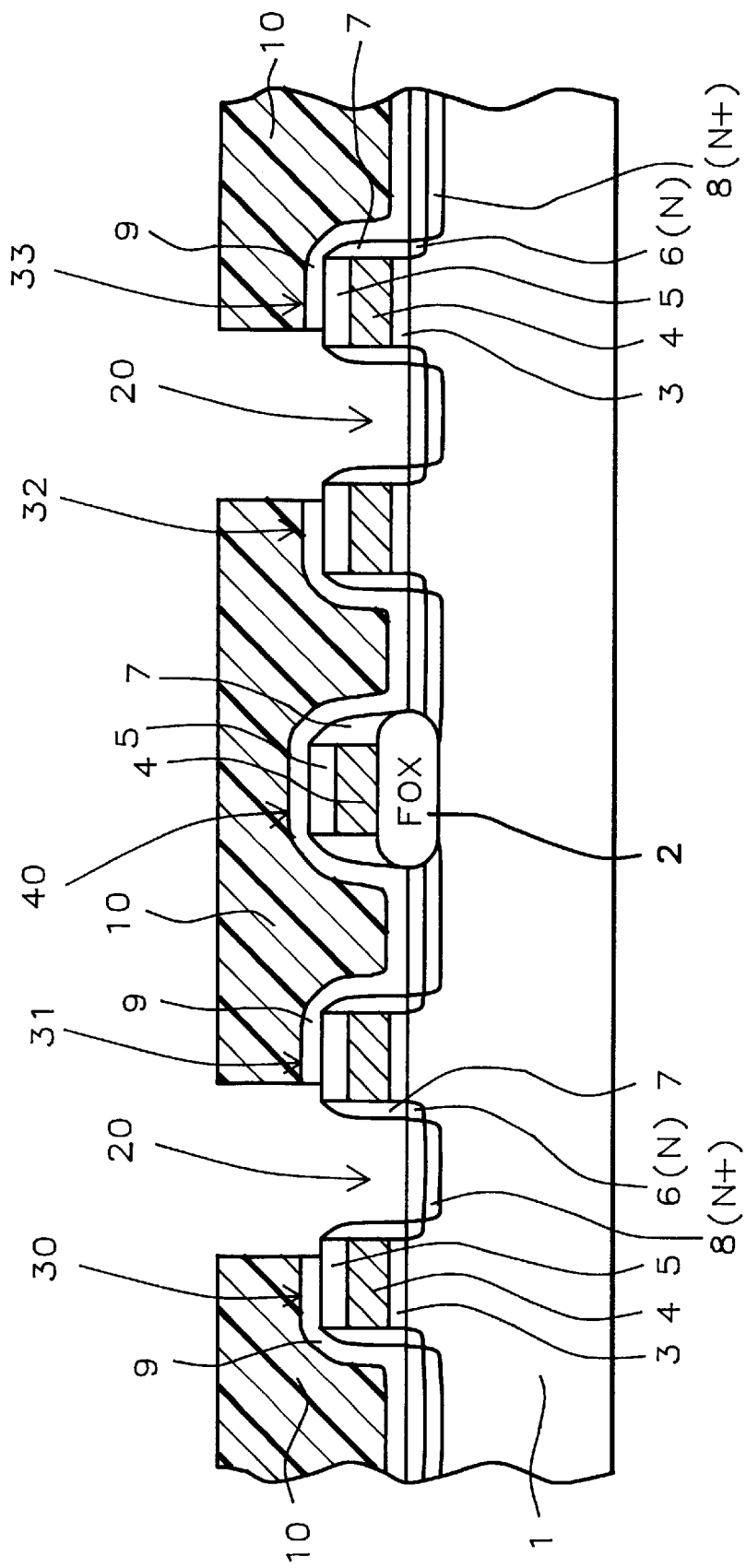

A first silicon nitride layer 9, is deposited using LPCVD or PECVD procedures, to a thickness between about 600 to 1000 Angstroms. A photoresist shape 10, with an opening exposing the source and drain region between polysilicon gate structure 30, and polysilicon gate structure 31, and with an opening exposing the source and drain region between polysilicon gate structure 32, and polysilicon gate structure 33, is formed. These openings are larger in width than the space between polysilicon gate structures, therefore these openings also expose a portion of first silicon nitride layer 9, overlying the polysilicon gate structures. An anisotropic RIE procedure, using $CHF_3$ and argon as an etchant, is next performed removing the portions of first silicon nitride layer 9, exposed in the openings in photoresist shape 10, and creating SAC openings 20, shown schematically in FIG. 2. SAC openings 20, or the width of exposed source and drain regions, between the insulator spacer coated, polysilicon gate structures, is between about 0.30 to 0.80 $\mu$M. Photoresist shape 10, is removed via plasma oxygen ashing and careful wet cleans.

Figure 3:
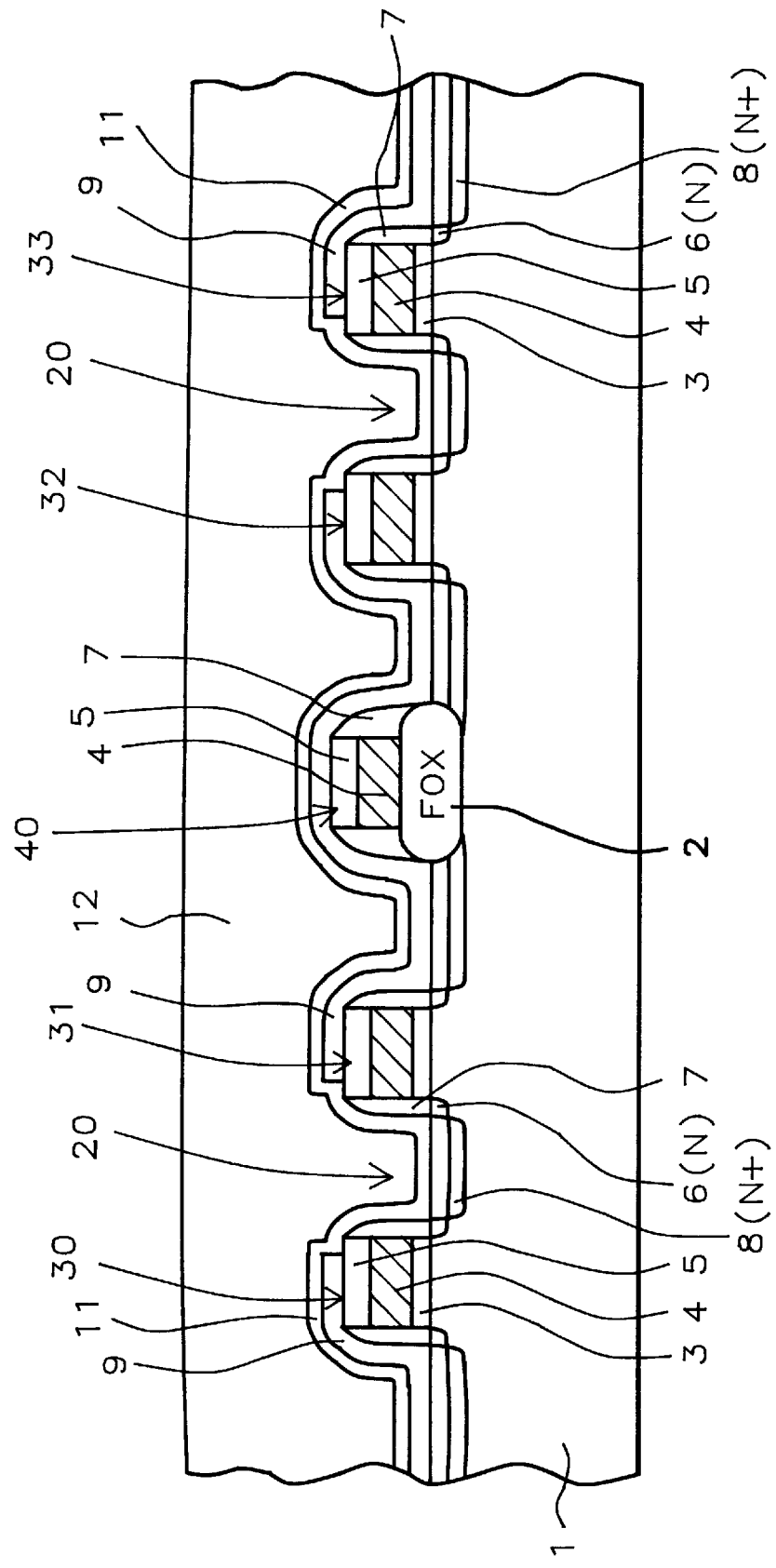

A second silicon nitride layer 11, is deposited using LPCVD or PECVD procedures, to a thickness between about 200 to 400 Angstroms. An interlevel dielectric layer 12, (ILD), is then deposited, comprised of undoped plasma enhanced silicon oxide, (PETEOS), deposited to a thickness between about 1000 to 2000 Angstroms, using tetraethylorthosilicate, (TEOS), as a source, and followed by an overlying layer of boro-phosphosilicate glass, (BPTEOS), layer, deposited to a thickness between about 3000 to 12000 Angstroms. An anneal is next performed at a temperature between about 750° to 900° C., to reflow ILD layer 12, resulting in the smooth top surface, schematically shown in FIG. 3.

Figure 4:
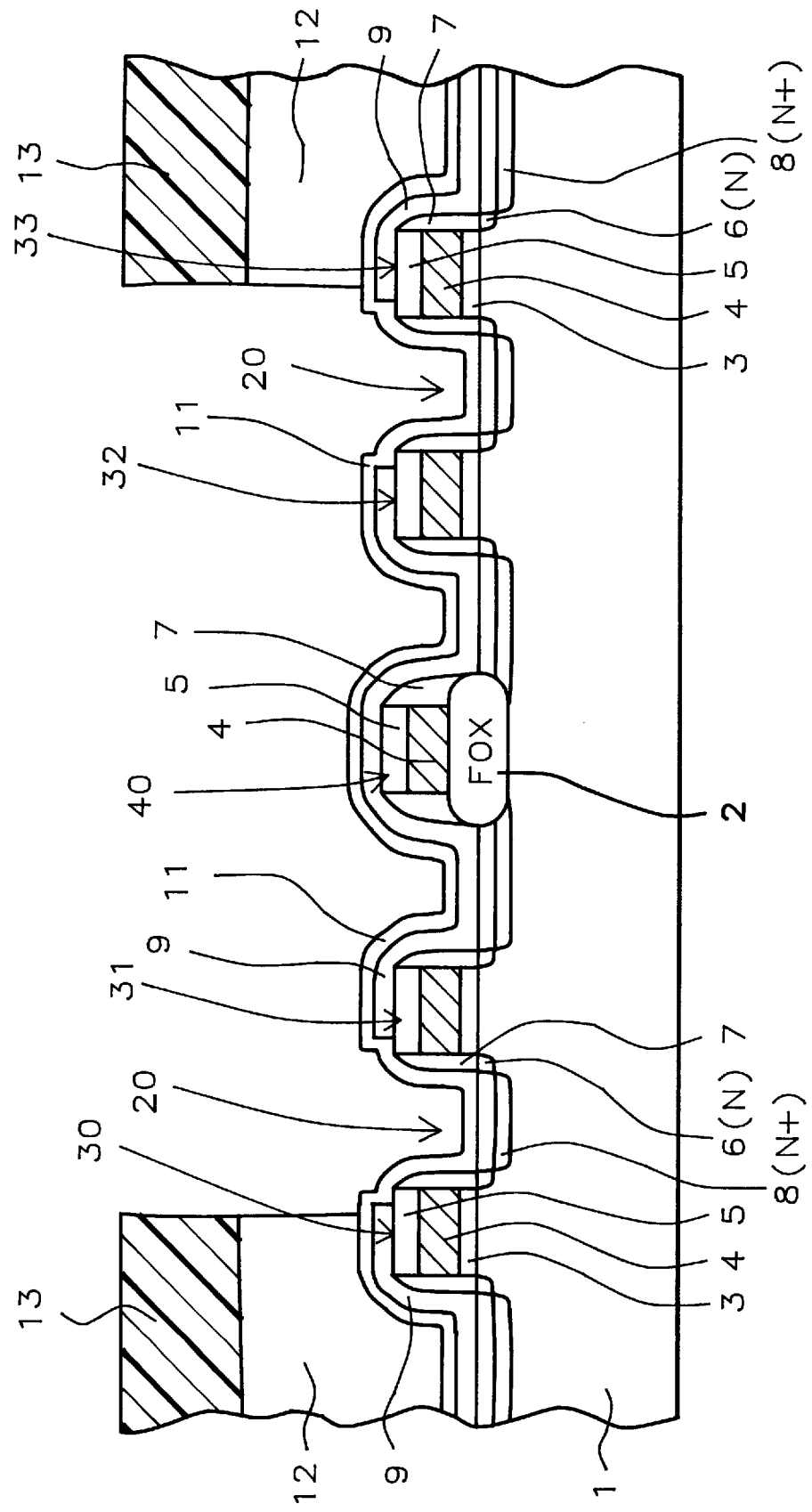
Figure 5:
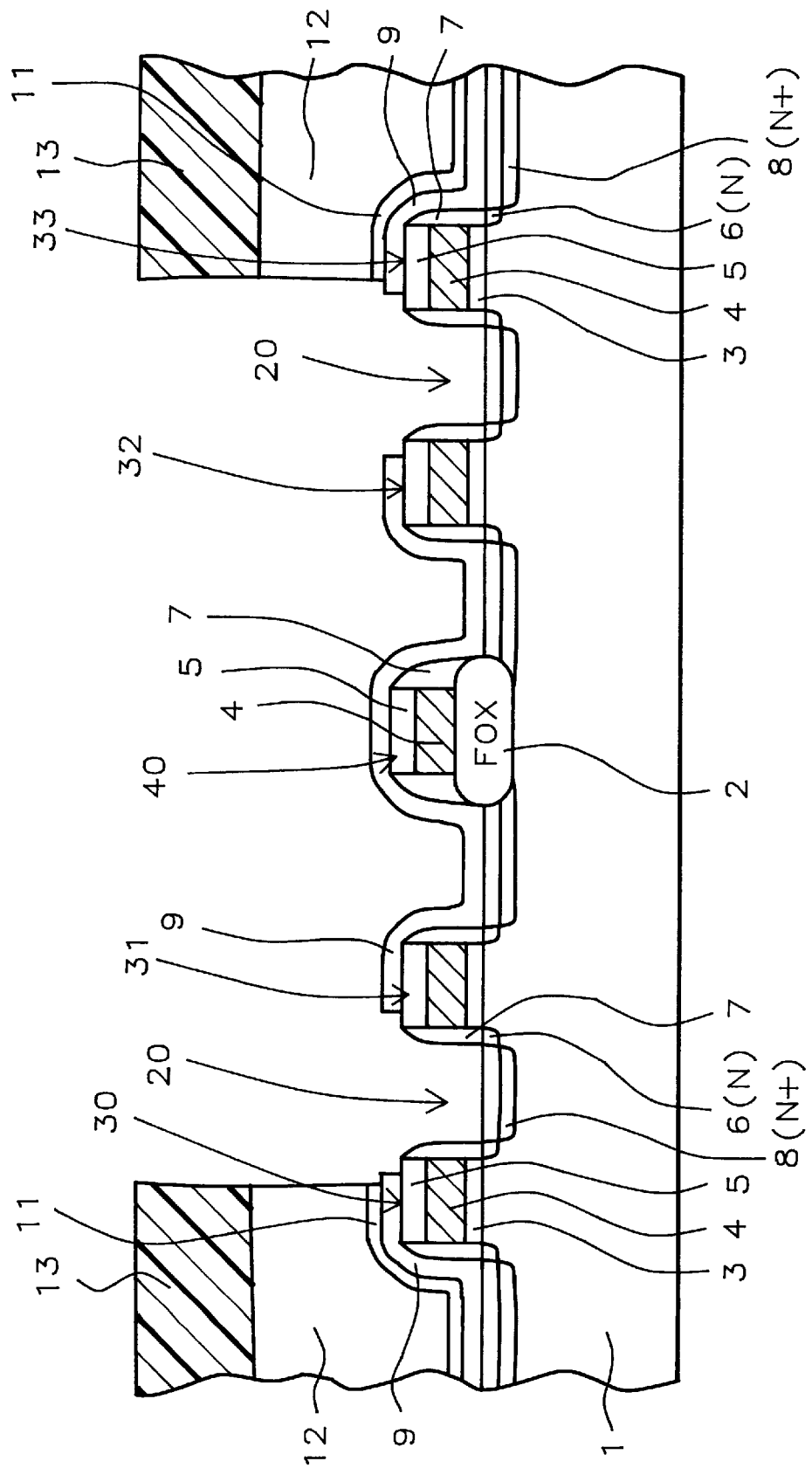

Photoresist shape 13, is next formed, featuring an opening exposing the area between polysilicon gate structure 30, and polysilicon gate structure 33. This opening will define the local interconnect region. An anisotropic RIE procedure, using $CHF_3$ as an etchant is used to remove ILD layer 12, exposed in the opening in photoresist shape 13. This RIE procedure offers the selectivity needed to prevent etching of second silicon nitride layer 11, after removal of ILD layer 12. This is schematically shown in FIG. 4. Another anisotropic RIE procedure is performed, using $CHF_3$ and argon as an etchant, and used to remove second silicon nitride layer 11, exposed in the opening in photoresist shape 13. The result of this RIE procedure, schematically shown in FIG. 5, again results in SAC openings 20, exposing a source and drain region between polysilicon gate structure 30, and polysilicon gate structure 31, and exposing a source and drain region between polysilicon gate structure 32 and polysilicon gate structure 33. Removal of photoresist shape is again accomplished via plasma oxygen ashing and careful wet cleans.

Figure 6:
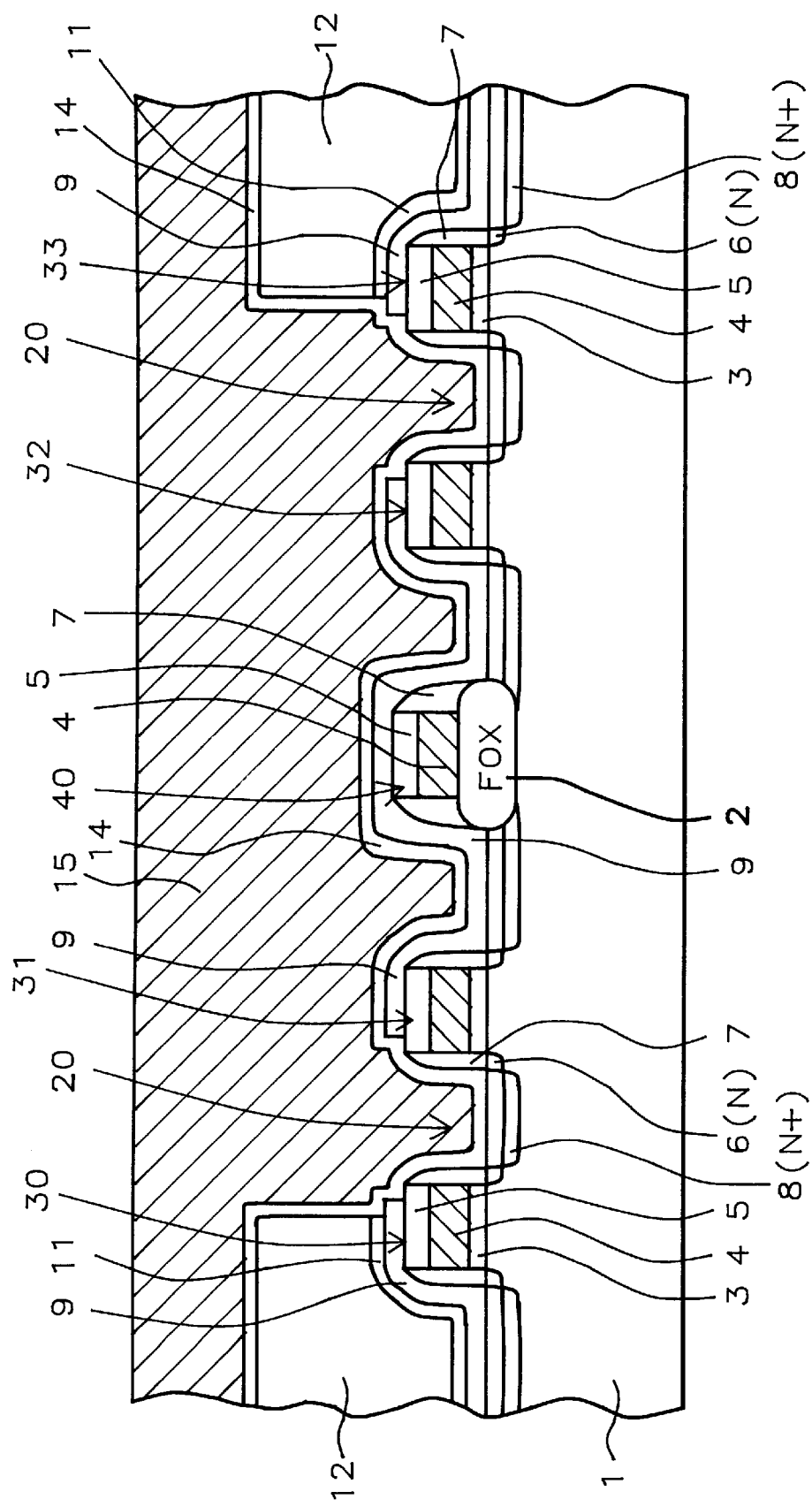
Figure 7:
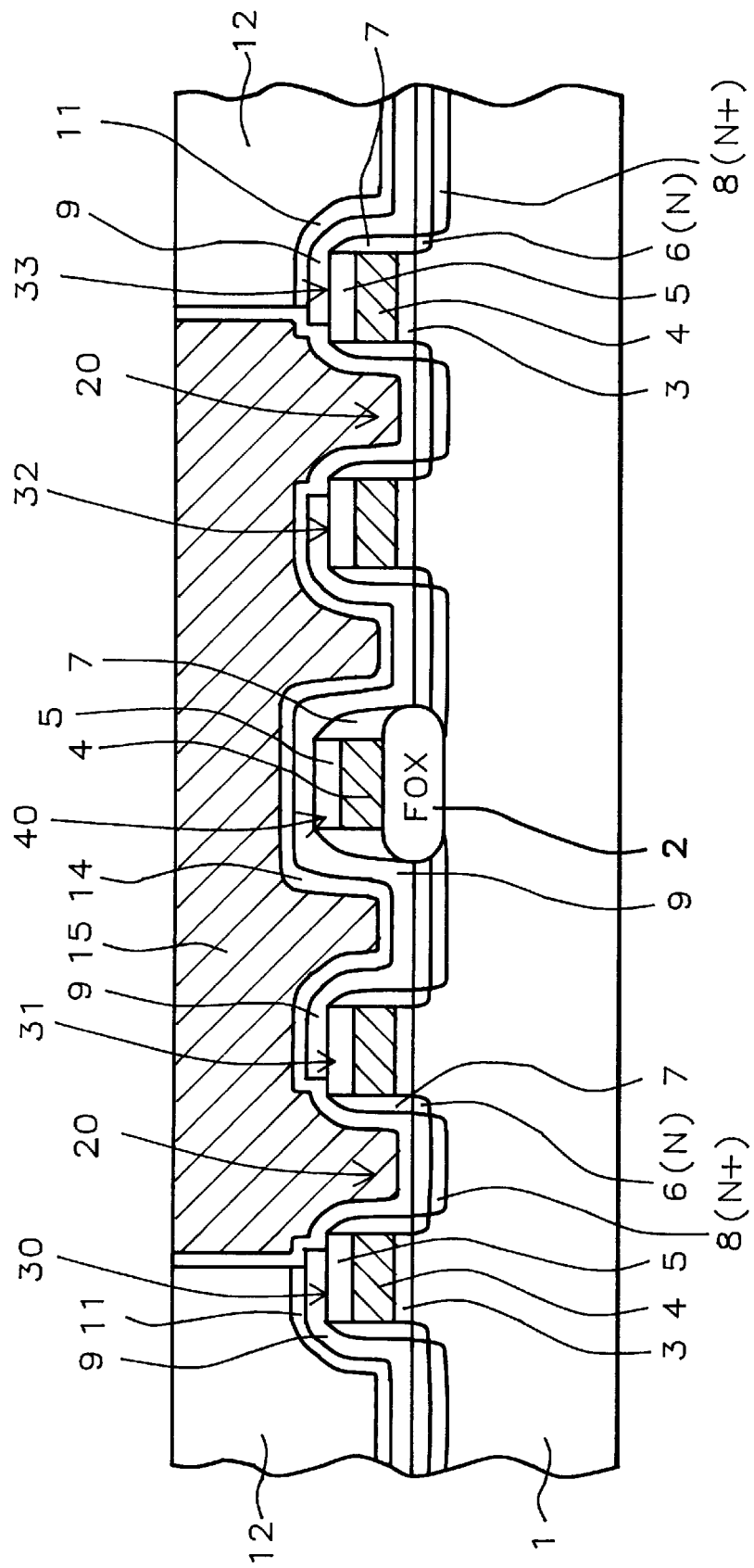

A composite layer 14, comprised of an underlying adhesive layer of titanium, and an overlying barrier layer of titanium nitride, is deposited using r. f. sputtering procedures, to a composite thickness between about 500 to 1500 Angstroms. A layer of tungsten 15, is then deposited, using LPCVD procedures, at a temperature between about 375° to 500° C., to a thickness between about 4000 to 7000 Angstroms, using tungsten hexafluoride and silane as a source, and completely filling the opening in ILD layer 12. The composite layer 14, and the overlying tungsten layer 15, directly contact the source and drain regions, exposed in SAC openings 20. This is schematically shown in FIG. 6. Tungsten layer 15, can be replaced by other conductive layers, such as molybdenum, doped polysilicon, or metal silicides. Regions of unwanted composite layer 14, and tungsten layer 15, overlying ILD layer 12, are next removed using an anisotropic RIE procedure, using $SF_6$ as an etchant, resulting in tungsten plug 15, in the ILD opening. The removal of these layers can also be accomplished using a chemical mechanical polishing, (CMP), procedure. This is schematically shown in FIG. 7. The conductive plug, comprised of composite layer 14, and tungsten layer 15, connects the source and drain region, between polysilicon gate structure 30, and polysilicon gate structure 31, to a source and drain region, between polysilicon gate structure 32, and polysilicon gate structure 33. This local interconnect structure allows the integration of these elements, at a local level, reducing subsequent topography concerns, which could occur if this connection were to realized using upper metal levels.

While this invention has been particularly shown and described with reference to, the preferred embodiments thereof, it will be understood by those skilled in the art that various changes in form and details may be made without departing from the spirit and scope of this invention.

What is claimed is:

1. A method of integrating elements of MOSFET devices, on a semiconductor substrate, via the use of a local interconnect structure, comprising the steps of:

forming a field oxide region in said semiconductor substrate;

forming a first polysilicon gate structure, and a second polysilicon gate structure, on a gate insulator layer, in a first region of said semiconductor substrate, and forming a third polysilicon gate structure, and a fourth polysilicon gate structure, on a gate insulator layer, in a second region of said semiconductor substrate, with said first region of said semiconductor substrate, and said second region of said semiconductor substrate, separated by said field oxide region;

forming insulator sidewall spacers on the sides of the polysilicon gate structures;

forming a first source and drain region, in a first region of said semiconductor substrate, between said first polysilicon gate structure, and said second polysilicon gate structure, and forming a second source and drain region, in said second region of said semiconductor substrate, between said third polysilicon gate structure, and said fourth polysilicon gate structure;

depositing a first insulator layer, on all polysilicon gate structures, on all insulator sidewall spacers, and on all source and drain regions;

forming a self-aligned contact, (SAC), opening, in said first insulator layer, exposing said first source and drain region, in said first region of said semiconductor substrate, and forming a SAC opening in said first insulator layer, exposing said second source and drain region, in said second region of said semiconductor substrate;

depositing a second insulator layer, on said first insulator layer, and on said first source and drain region, and on said second source and drain region, exposed in SAC openings;

forming a local interconnect opening in said second silicon insulator layer, exposing said first source and drain region, and said second source and drain region; and forming a local interconnect structure, in said local interconnect opening, contacting said first source and drain region, and said second source and drain region.

2. The method of claim 1, wherein said gate insulator layer is silicon dioxide, thermally grown, in an oxygen-steam ambient, at a temperature between about 850° to 1000° C., to a thickness between about 50 to 200 Angstroms.

3. The method of claim 1, wherein said polysilicon gate structures are a polycide layer, comprised of an underlying, N type, in situ doped, polysilicon layer, at a thickness between about 1000 to 2000 Angstroms, and an overlying tungsten silicide layer, at a thickness between about 500 to 1500 Angstroms, and capped with an overlying insulator layer of either silicon oxide, or silicon nitride, at a thickness between about 1000 to 3000 Angstroms.

4. The method of claim 1, wherein said first source and drain regions, and said second source and drain regions, are formed via ion implantation procedures, using either arsenic or phosphorous, at an energy between about 25 to 80 KeV, at a dose between about $1\times10^{15}$ to $6\times10^{15}$ atoms/cm$^2$.

5. The method of claim 1, wherein said first insulator layer is a silicon nitride layer, deposited using either LPCVD or PECVD procedures, to a thickness between about 600 to 1000 Angstroms.

6. The method of claim 1, wherein said SAC opening, is formed via anisotropic etching of said first insulator layer, using $CHF_3$ and argon as an etchant, creating an opening between about 0.3 to 0.8 micrometer, in the spaces between said polysilicon gate structures, exposing said first source and drain region, and said second source and drain region.

7. The method of claim 1, wherein said second insulator layer is comprised of an underlying silicon nitride layer, at a thickness between about 200 to 400 Angstroms, and an overlying composite layer, comprised of a BPTEOS layer, at a thickness between about 3000 to 12000 Angstroms, overlying an undoped PETEOS layer, at a thickness between about 1000 to 2000 Angstroms.

8. The method of claim 7, wherein said local interconnect opening is formed in said second insulator layer via anisotropic RIE procedures, using $CHF_3$ as an etchant for the BPTEOS and PETEOS layers, while $CHF_3$ and argon is used as an etchant for silicon nitride.

9. The method of claim 1, wherein said local interconnect structure is deposited using LPCVD or r.f. sputtering procedures, to a thickness between about 4000 to 7000 Angstroms, and an underlying composite layer, comprised of titanium nitride layer on a titanium layer, deposited using r.f. sputtering procedures, at a thickness between about 500 to 1500 Angstroms.

10. The method of claim 1, wherein said local interconnect structure is formed via anisotropic RIE procedures, using $SF_6$ as an etchant.

11. The method of claim 1, wherein said local interconnect structure is formed via chemical mechanical polishing procedures.

12. A method for connecting elements of MOSFET devices, on a semiconductor substrate, via use of a self-aligned, local interconnect structure, formed using silicon nitride capping SAC processing, comprising the steps of:

forming a field oxide region in said semiconductor substrate;

forming a first polysilicon gate structure, and a second polysilicon gate structure, on a gate insulator layer, in a first region of said semiconductor substrate, and forming a third polysilicon gate structure, and a fourth polysilicon gate structure, on a gate insulator layer, in a second region of said semiconductor substrate, with said first region of said semiconductor substrate, and said second region of said semiconductor substrate, separated by said field oxide region;

forming insulator sidewall spacers on the sides of the polysilicon gate structures:

forming a first heavily doped source and drain region in said first region of said semiconductor substrate, between said first polysilicon gate structure, and said second polysilicon gate structure, and forming a second heavily doped source and drain region in said second region of said semiconductor substrate, between said third polysilicon gate structure, and said fourth polysilicon gate structure;

depositing a first silicon nitride layer on said polysilicon gate structures, on said insulator sidewall spacers, and on said heavily doped source and drain regions;

forming a SAC opening, in said first silicon nitride layer, exposing said first heavily doped source and drain region, and forming a SAC opening, in said first silicon nitride layer, exposing said second heavily doped source and drain region;

depositing a second silicon nitride layer, on said first silicon nitride layer, and on said first heavily doped source and drain region, and on said second heavily doped source and drain region, exposed in the SAC openings;

depositing a composite interlevel dielectric layer on said second silicon nitride layer;

forming a local interconnect opening in said interlevel dielectric layer, and in said second silicon nitride layer, exposing said first heavily doped source and drain region, and said second heavily doped source and drain region;

depositing a composite layer of an underlying adhesive layer, and an overlying barrier layer, in said local interconnect opening;

depositing a tungsten layer, the overlying barrier layer, of said composite layer; and an overlying; and patterning of said tungsten layer, and of said composite layer, to form said self-aligned local interconnect structure, contacting said first heavily doped source and drain region, and said second heavily doped source and drain region.

13. The method of claim 12, wherein said gate insulator layer is silicon dioxide, thermally grown in an oxygen-steam ambient, at a temperature between about 850 to 1000° C., to a thickness between about 50 to 200 Angstroms.

14. The method of claim 12, wherein polysilicon gate structures are a polycide layer, comprised of an underlying, N type, in situ doped polysilicon layer, at a thickness between about 1000 to 2000 Angstroms, and an overlying tungsten silicide layer, at a thickness between about 500 to 1500 Angstroms, and with said polysilicon gate structures capped with an overlying silicon oxide layer, deposited using TEOS as a source, to a thickness between about 1000 to 3000 Angstroms.

15. The method of claim 12, wherein heavily doped source and drain regions are formed via ion implantation of either arsenic or phosphorous, at an energy between about 25 to 80 KeV, at a dose between about $1\times10^{15}$ to $6\times10^{15}$ atoms/cm$^2$.

16. The method of claim 12, wherein said first silicon nitride layer is deposited using LPCVD or PECVD procedures, to a thickness between about 600 to 1000 Angstroms.

17. The method of claim 12, wherein said SAC opening, in said first silicon nitride layer, is formed via anisotropic RIE procedures, using CHF$_3$ and argon as an etchant, creating a space between about 0.3 to 0.8 micrometer, in width, between polysilicon gate structures, and exposing said first heavily doped source and drain region, and said second heavily doped source and drain region.

18. The method of claim 12, wherein said second silicon nitride layer, is deposited using LPCVD or PECVD procedures, to a thickness between about 200 to 400 Angstroms.

19. The method of claim 12, wherein said composite interlevel dielectric layer is comprised of an underlying, undoped PETEOS layer, at a thickness between about 1000 to 2000 Angstroms, and an overlying BPTEOS layer, at a thickness between about 3000 to 12000 Angstroms.

20. The method of claim 12, wherein said local interconnect opening is formed via anisotropic RIE of said composite interlevel dielectric layer, using CHF$_3$ as an etchant, and via anisotropic RIE of said second silicon nitride layer, using CHP$_3$ as an etchant.

21. The method of claim 12, wherein composite adhesive and barrier layer is deposited using r.f. sputtering, to a thickness between about 500 to 1500 Angstroms, comprised of an underlying titanium adhesive layer, and an overlying titanium nitride barrier layer.

22. The method of claim 12, wherein said tungsten layer is deposited using LPCVD procedures, to a thickness between about 4000 to 7000 Angstroms.

23. The method of claim 12, wherein said self-aligned local interconnect structure is formed via anisotropic RIE of said tungsten layer, and of said composite adhesive and barrier layer, using SF$_6$ as an etchant.

* * * * *